United States Patent
Narita

[19]

[11] Patent Number: 6,081,013
[45] Date of Patent: *Jun. 27, 2000

[54] SEMICONDUCTOR DEVICE HAVING A REDUCED DISTANCE BETWEEN THE INPUT RESISTOR AND THE INTERNAL CIRCUIT

[75] Inventor: Kaoru Narita, Tokyo, Japan

[73] Assignee: NEC Corporation, Tokyo, Japan

[ * ] Notice: This patent is subject to a terminal disclaimer.

[21] Appl. No.: 09/159,788

[22] Filed: Sep. 24, 1998

Related U.S. Application Data

[63] Continuation of application No. 08/896,952, Jul. 18, 1997, Pat. No. 5,869,871, which is a continuation of application No. 08/610,414, Mar. 4, 1996, abandoned.

[30] Foreign Application Priority Data

Mar. 4, 1995 [JP] Japan ................................. 7-70876

[51] Int. Cl.⁷ ................................................. H01L 23/62
[52] U.S. Cl. .......................................... 257/355; 257/356
[58] Field of Search ..................................... 257/355, 356, 257/357, 358, 360, 363

[56] References Cited

U.S. PATENT DOCUMENTS 4,617,482  10/1986  Matsuda .................................. 257/358
5,739,571  4/1998  Kurachi ................................... 257/360
5,869,871  2/1999  Narita ..................................... 257/355

FOREIGN PATENT DOCUMENTS 59-87873  5/1984  Japan ..................................... 257/355
8-191132  7/1996  Japan ..................................... 257/355

OTHER PUBLICATIONS

C. Duvvury et al., "Internal Chip ESD Phenomena Beyond the Protection Circuit," IEEE Transactions on Electron Devices, vol. 35, No. 12, Dec. 1988, pp. 2133–2139.

Korean Patent Office Action relating to Korean Patent Application No. 1996–5537, issued on Dec. 13, 1998 (with English translation), by the Korean Patent Office.

*Primary Examiner*—Steven H. Loke
*Attorney, Agent, or Firm*—Sughrue, Mion, Zinn, Macpeak & Seas, PLLC

[57] ABSTRACT

In a semiconductor device including a semiconductor substrate, first and second external terminals, a first impurity diffusion region connected to the first external terminal, and second and third impurity diffusion regions forming a MIS transistor, one of the second and third impurity diffusion regions facing the first impurity region is connected to the second external terminal. The distance between the first diffusion region and the MIS transistor is substantially smaller than a certain value compared to conventional devices.

5 Claims, 11 Drawing Sheets

SEMICONDUCTOR DEVICE HAVING A REDUCED DISTANCE BETWEEN THE INPUT RESISTOR AND THE INTERNAL CIRCUIT

This is a continuation of application Ser. No. 08/896,952 filed on Jul. 18, 1997, now U.S. Pat. No. 5,869,871, which is a continuation of Ser. No. 08/610,414 filed on Mar. 4, 1996, now abandoned.

BACKGROUND OF THE INVENTION

1. Field of the Invention

The present invention relates to a semiconductor device, and more particularly, to a semiconductor device capable of avoiding damage by electrostatic discharge (ESD) phenomena.

2. Description of the Related Art

Generally, in a semiconductor device, an input circuit includes a first external terminal and an input resistor formed by an N-type impurity diffusion region connected to the first external terminal. On the other hand, an internal circuit such as an N-channel MOS (broadly, MIS) transistor has an N-type impurity diffusion source region connected to a second external terminal, an N-type impurity diffusion drain region, and a gate electrode therebetween. In this case, the drain rather than the source of the MOS transistor faces the input resistor (see: JP-A-59-87873). This will be explained later in detail.

Therefore, when a negative electrostatic pulse with respect to the second terminal is applied to the first external terminal, electrons are injected from the input resistor into a semiconductor substrate. Accordingly, the electrons are diffused and some of them reach the source region of the MOS transistor. As a result, the electrons injected into the source region serve as an energy source due to a high electric field in the periphery of the source region, thus destroying a gate insulating layer and the like. Particularly, if the MOS transistor has a lightly-doped drain (LDD) configuraturation, some of the electrons reach an $N^-$-type region of the source region, so that the $N^-$-type region may be destroyed.

In the above-described prior art semiconductor device, however, in order to avoid the destruction of the gate insulating layer, the source region and the like, a distance between the input resistor and the internal circuit has to be very large, for example, about 100 µm to 300 µm, thus reducing the number of electrons reaching the source region. Here, a minimum value of this distance is called a critical distance. The larger this distance, increases the amount of dead space where elements cannot be arranged.

Thus, the prior art semiconductor device is disadvantageous in terms of integration.

SUMMARY OF THE INVENTION

It is an object of the present invention to reduce the dead space of a semiconductor device due to the electrostatic discharge phenomena.

According to the present invention, in a semiconductor device including a semiconductor substrate, first and second external terminals, a first impurity diffusion region connected to the first external terminal, and second and third impurity diffusion regions forming a MOS transistor, one of the second and third impurity diffusion regions facing the first impurity region is connected to the second external terminal. The distance between the first diffusion region and the MOS transistor is smaller than a certain value. Thus, the number of electrons which reach a gate portion of the MOS transistor is reduced, and accordingly, the destruction of a gate insulating layer and the like can be avoided.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the description of the preferred embodiments, prior art semiconductor devices will be explained with reference to FIGS. 1, 2, 3, 4 and 5.

Figure 1:
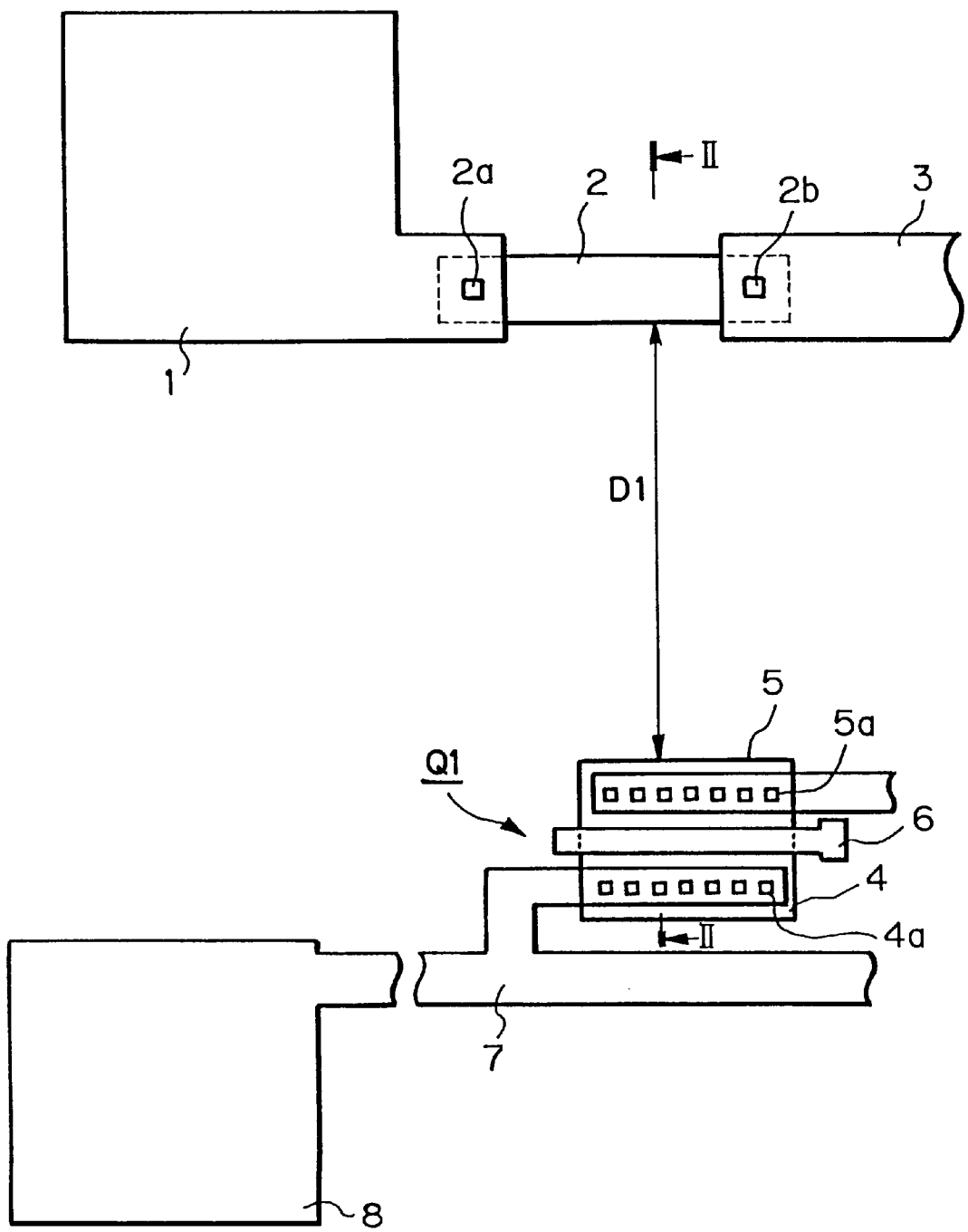
FIG. 1 is a layout diagram illustrating a first prior art semiconductor device.

In FIG. 1, which illustrates a first prior art semiconductor device (see: JP-A-59-87873), reference numeral 1 designates an input terminal which is connected via an input resistor 2 formed by an N-type diffusion region to an internal connection layer 3. Also, reference numeral 2a designates a contact structure which connects the input resistor 2 to the input terminal 1, and reference numeral 2b designates a contact structure which connects the input resistor 2 to the internal connection layer 3.

On the-other hand, an N-channel MOS transistor Q1 of an internal circuit is formed at a distance D1 from the input resistor 2. The transistor Q1 is comprised of an N-type source region 4, an N-type drain region 5, and a gate electrode 6 therebetween. The source region 4 is connected via a ground connection layer 7 to a ground terminal 8. The drain region 5 is connected to a P-channel MOS transistor (not shown) or the like. Also, a contact structure 4a connects the source region 4 to the ground connection layer 7, and a contact structure 5a connects the drain region 5 to the P-channel MOS transistor (not shown).

In FIG. 1, the drain region 5 rather than the source region 4 faces the input resistor 2.

In order to attain complete protection against electrostatic discharge phenomena, the distance D1 has to be from about 100 µm to 300 µm.

Figure 2:
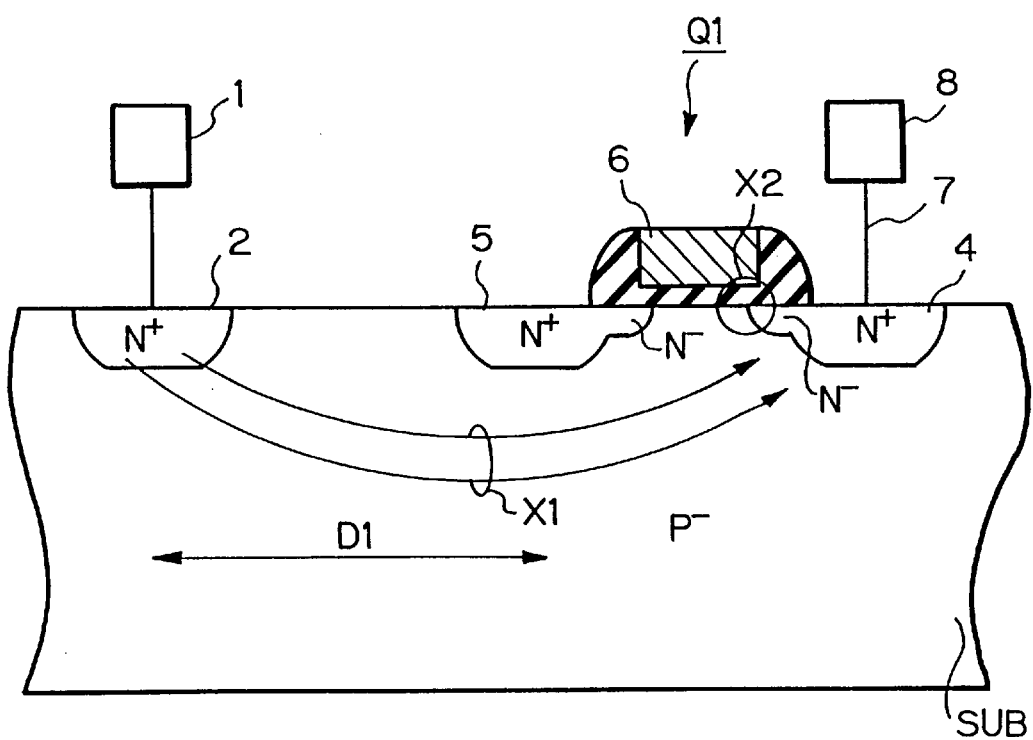
FIG. 2 is a cross-sectional view taken along the line II—II of FIG. 1.

Referring to FIG. 2, which is a cross-sectional view taken along the line II—II of FIG. 1, when a negative electrostatic pulse with respect to the ground terminal 8 is applied to the input terminal 1, electrons are injected from the input resistor 2 into P⁻-type semiconductor substrate SUB. Therefore, the electrons injected into the substrate SUB are diffused as indicated by X1, and the electrons reach the source region 4. In this case, the source region 4 is of an LDD configuration, some of the electrons reach an N⁻-type region of the source region 4 as indicated by X2. As a result, the electrons injected into the N⁻-type region of the source region 4 serve as a high energy source due to a high electric field generated in the periphery of the source region 4, and accordingly, a gate insulating layer between the substrate SUB and the gate electrode 6 as well as the N⁻-type region of the source region 4 is destroyed.

Particularly, as semiconductor devices have become more developed, the gate insulating layer has become thinner and the LDD configuration has usually been adopted, so that the above-described destruction by the electrostatic discharge phenomenon may easily occur.

Note that, when the distance D1 is very large, the electrons injected into the substrate SUB are recombined with holes therein, so that the number of electrons which reach the N⁻-type region is reduced. Thus, the destruction by the electrostatic discharge phenomenon hardly occurs.

Therefore, in FIGS. 1 and 2, although the distance D1 depends upon the concentration of impurities of the substrate SUB and the impurity profile of the source region 4, the distance D1 has to be about 100 $\mu$m to 300 $\mu$m larger than a critical distance $D_{cr}$. In other words, it is impossible to arrange internal elements within a range, so-called a dead space, having a radius of some hundred $\mu$m from the input terminal 1. Such a dead space is disadvantageous in terms of integration. Particularly, in a semiconductor device having a large number of input terminals, the above-mentioned dead space reduces the integration.

Figure 3:
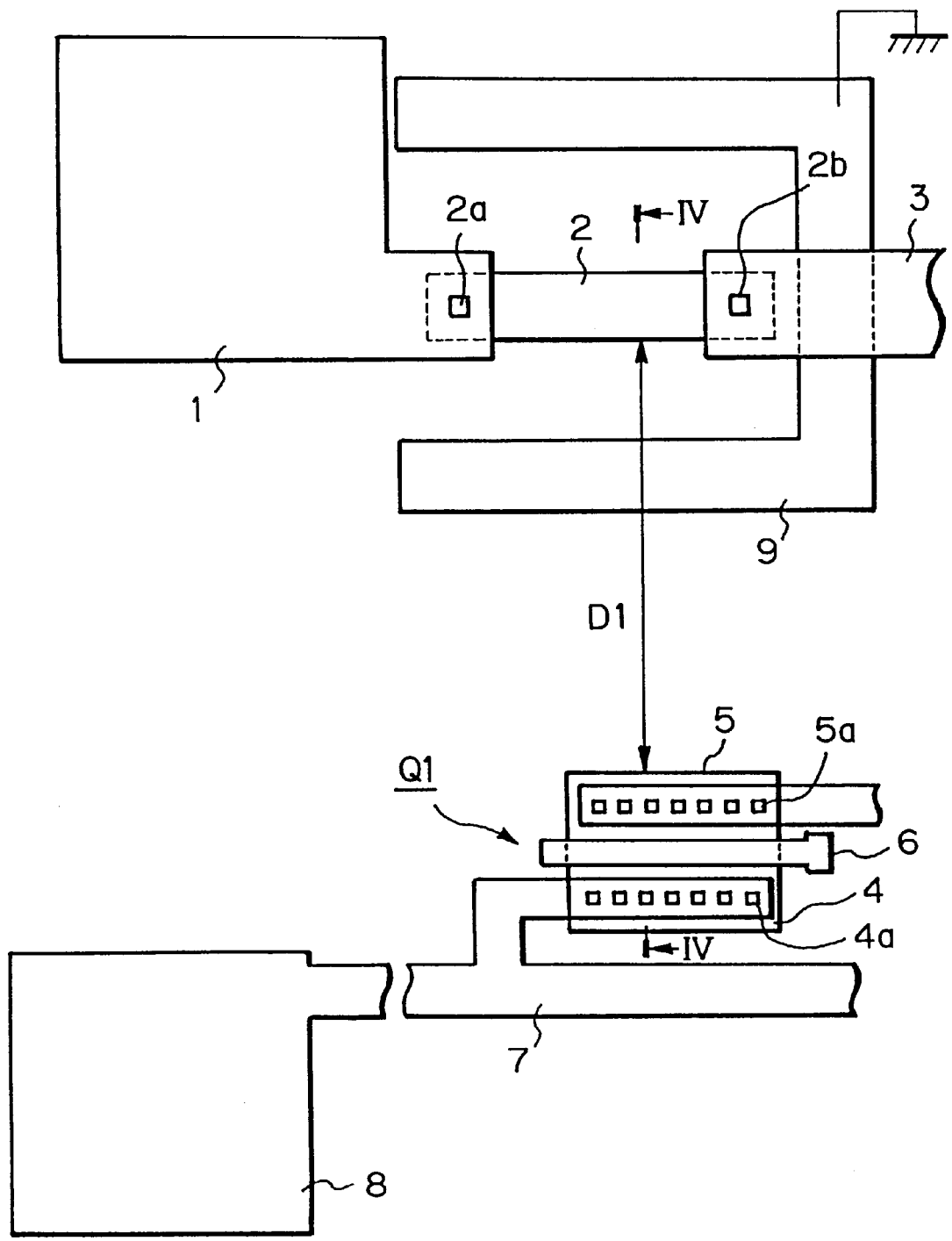
FIG. 3 is a layout diagram illustrating a second prior art semiconductor device.
Figure 4:
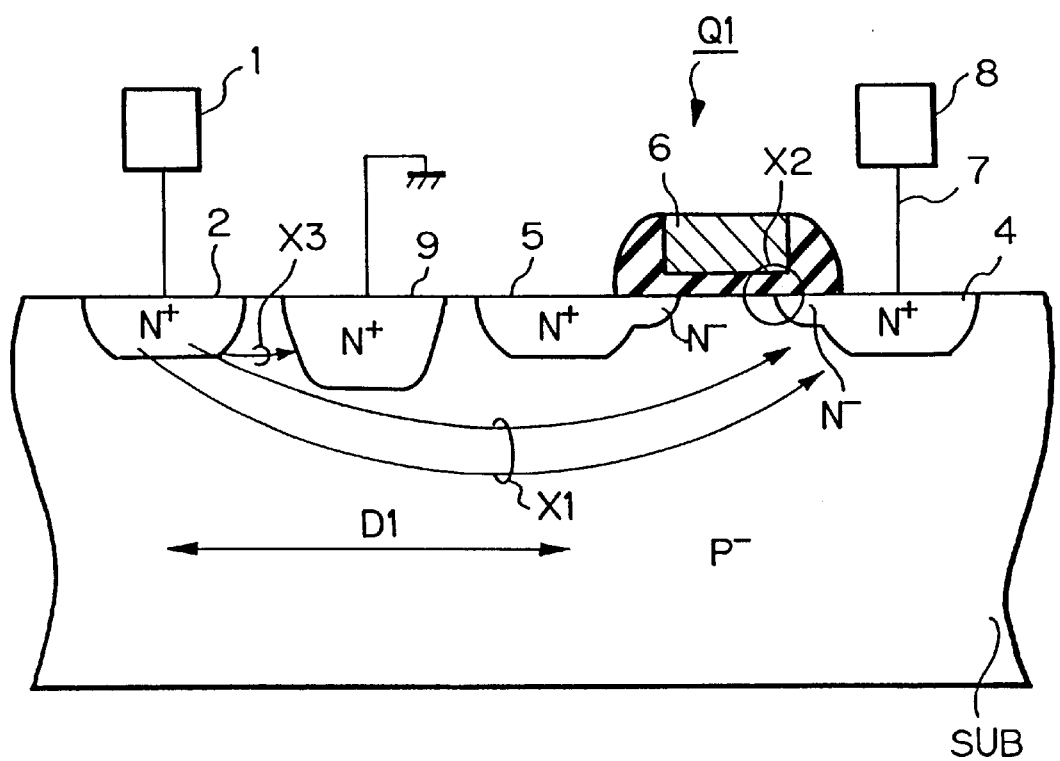
FIG. 4 is a cross-sectional view taken along the line IV—IV of FIG. 3.

In FIG. 3, which illustrates a second prior art semiconductor device, a grounded N-type well 9 surrounding the input resistor 2 is added to the elements of FIG. 1. The N-type well 9 can absorb some of the electrons as indicated by X3 in FIG. 4 injected from the input resistor 2 into the substrate SUB. In this case, however, most of the electrons injected from the input resistor 2 into the substrate SUB move through a region deeper than the N-type well 9, and therefore, the effect of the N-type well 9 is not large, on the contrary, the presence of the N-type well 9 increases the above-mentioned dead space, thus further reducing the integration.

Figure 5:
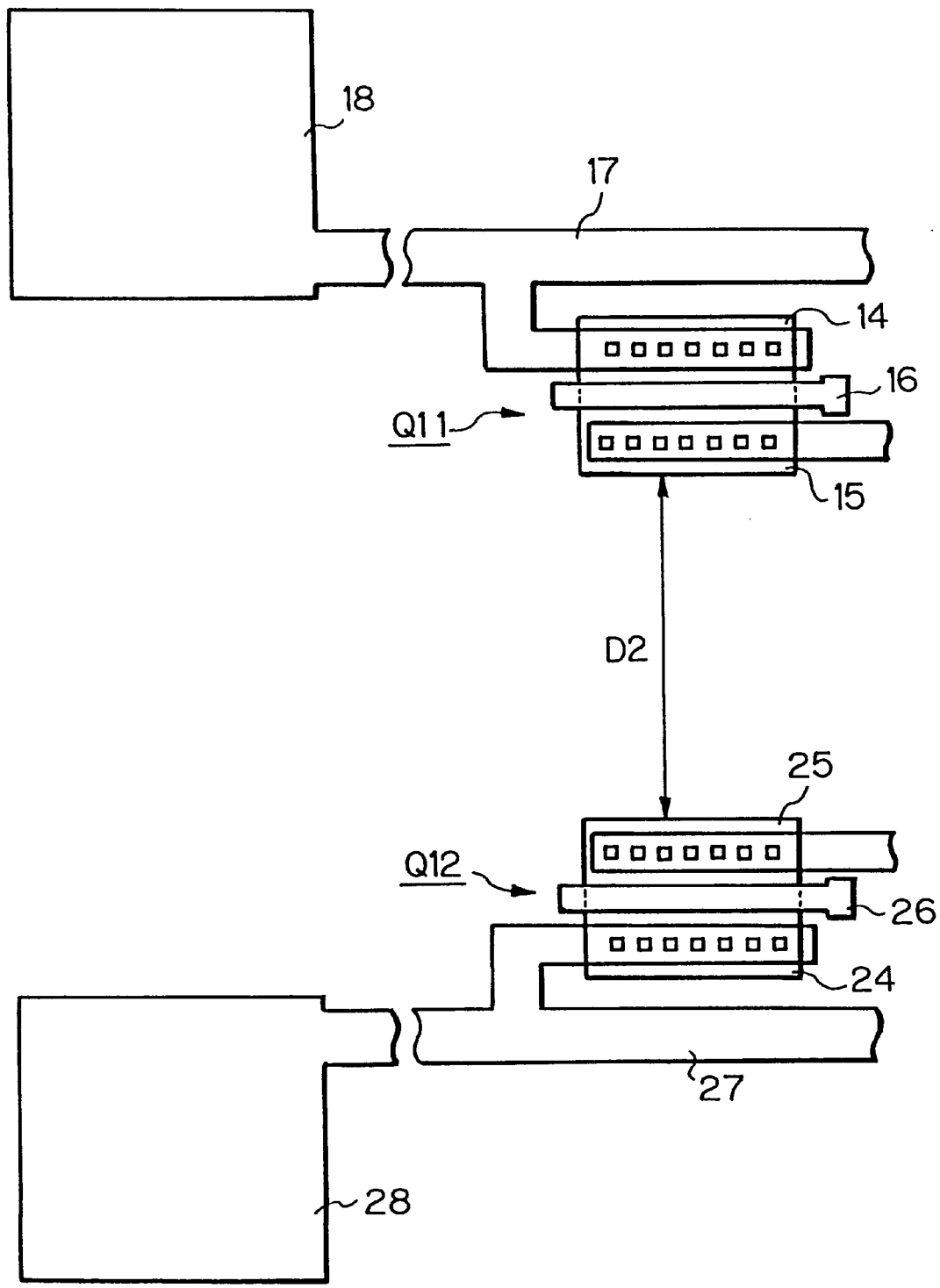
FIG. 5 is a layout diagram illustrating a third prior art semiconductor device.

In FIG. 5, which illustrates a third prior art semiconductor device, an N-channel MOS transistor Q11 is located at a distance D2 from an N-channel MOS transistor Q12. The MOS transistors Q11 and Q12 have the same configuration as the transistor Q1 of FIGS. 1 and 2. That is, the transistor Q11 is comprised of an N-type source region 14, an N-type drain region 15, and a gate electrode 16 therebetween. The source region 14 is connected via a ground connection layer 17 to a ground terminal 18. Similarly, the transistor Q12 is comprised of an N-type source region 24, an N-type drain region 25, and a gate electrode 26 therebetween. The source region 24 is connected via a ground connection layer 27 to a ground terminal 28.

Even in FIG. 5, when a negative electrostatic pulse with respect to the ground terminal 28 is applied to the ground terminal 18, electrons are injected from the source region 14 into the substrate (not shown). Therefore, the electrons injected into the substrate are diffused, and the electrons reach the source region 24. As a result, the gate insulating layer between the substrate and the gate electrode 26 as well as the source region 24 is destroyed.

Therefore, also in FIG. 5, the distance D2 between the transistors Q11 and Q12 has to be about 100 $\mu$m to 300 $\mu$m larger than the critical distance $D_{cr}$, which is disadvantageous in terms of integration.

Figure 6:
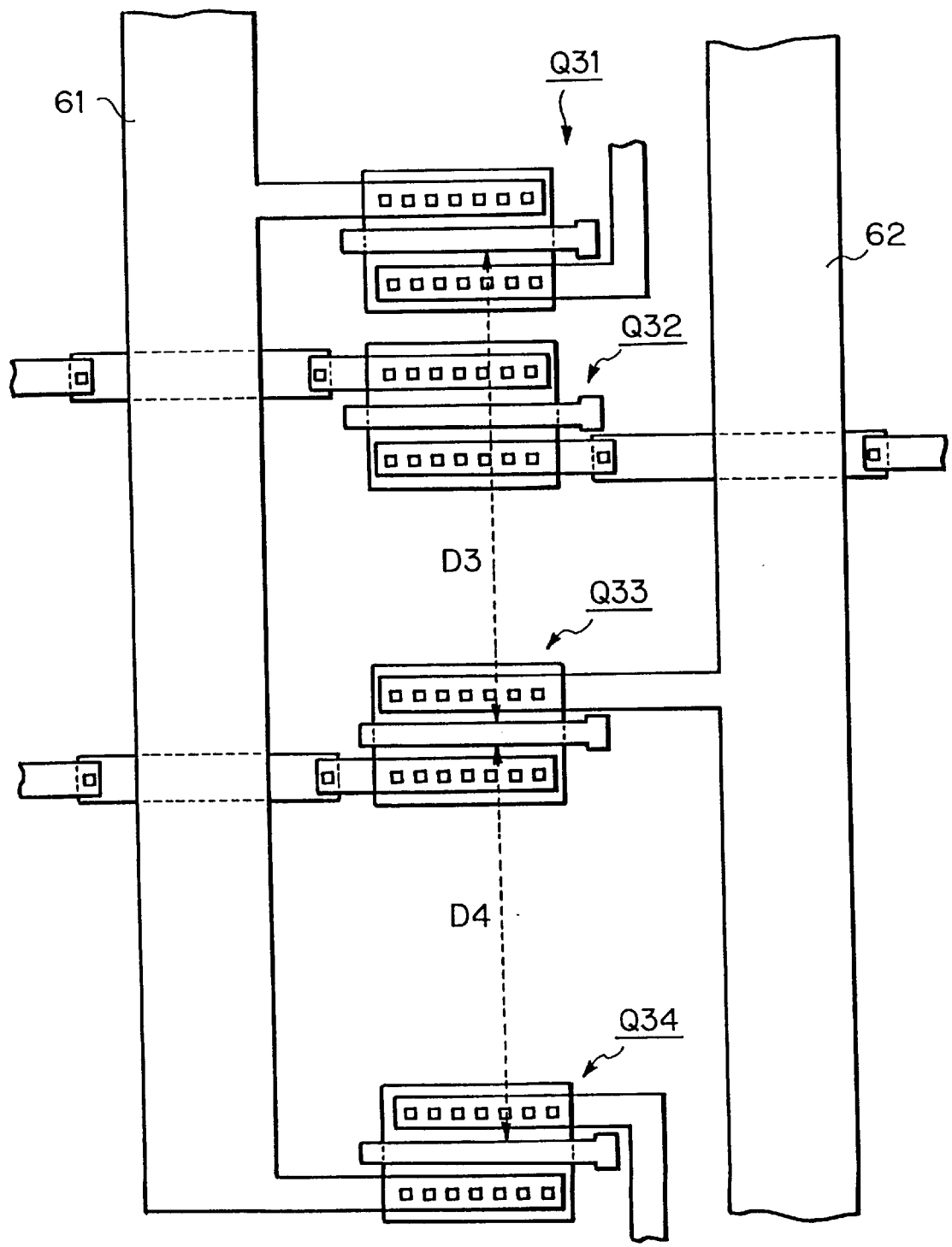
FIG. 6 is a layout diagram illustrating a fourth prior art semiconductor device.

In FIG. 6, which illustrates a fourth prior art semiconductor device, a plurality of ground connection layers, in this case, two ground connection layers 61 and 62 connected to ground voltage terminals (not shown) are provided, thus preventing noise generated in one block from being applied to another block. Also, N-channel MOS transistors Q31, Q32, Q33 and Q34 are provided between the ground connection layers 61 and 62. In this case, the source regions of the transistors Q31 and Q34 are connected to the ground connection layer 61, while the source region of the transistor Q33 is connected to the ground connection layer 62.

Therefore, in FIG. 6, a distance D3 between the transistors Q31 and Q33 has to be about 100 $\mu$m to 300 $\mu$m larger than the critical distance $D_{cr}$ although the transistor Q32, which is disconnected from the ground connection layers 61 and 62, is present between the transistors Q31 and Q33. Also, a distance D4 between the transistors Q33 and Q34 has to be about 100 $\mu$m to 300 $\mu$m larger than the critical distance $D_{cr}$. Thus, the device of FIG. 6 is disadvantageous in terms of integration.

Figure 7:
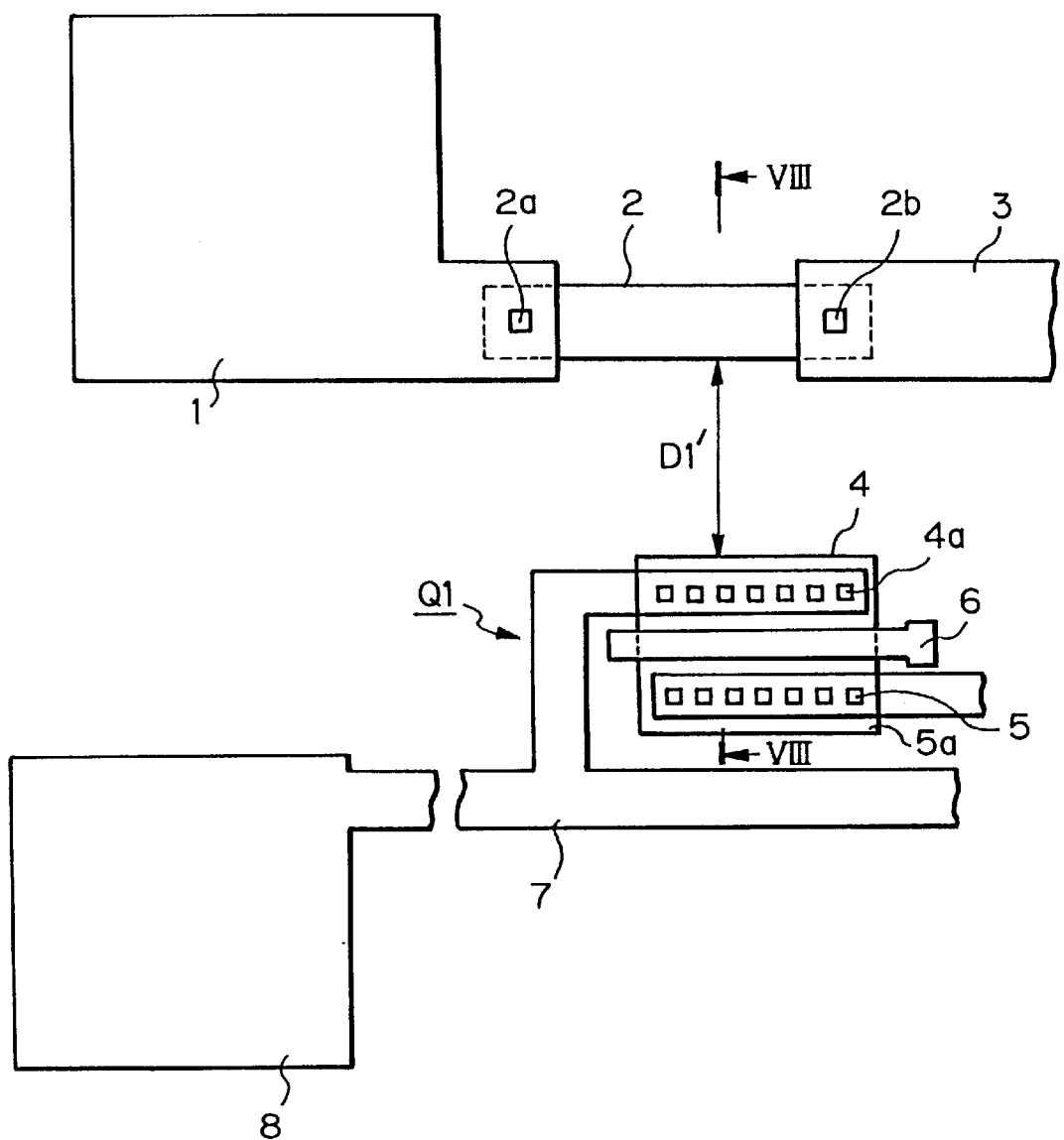
FIG. 7 is a layout diagram illustrating a first embodiment of the semiconductor device according to the present invention.

In FIG. 7, which illustrates a first embodiment of the present invention, the source region 4 and the drain region 5 of FIG. 1 are reversed. That is, the source region 4 rather than the drain region 5 faces the input resistor 2. In this case, a distance D1' between the input resistor 2 and the transistor Q1 is smaller than the distance D1 in FIG. 1, and is, for example, about 20 $\mu$m smaller than the critical distance $D_{cr}$.

Figure 8:
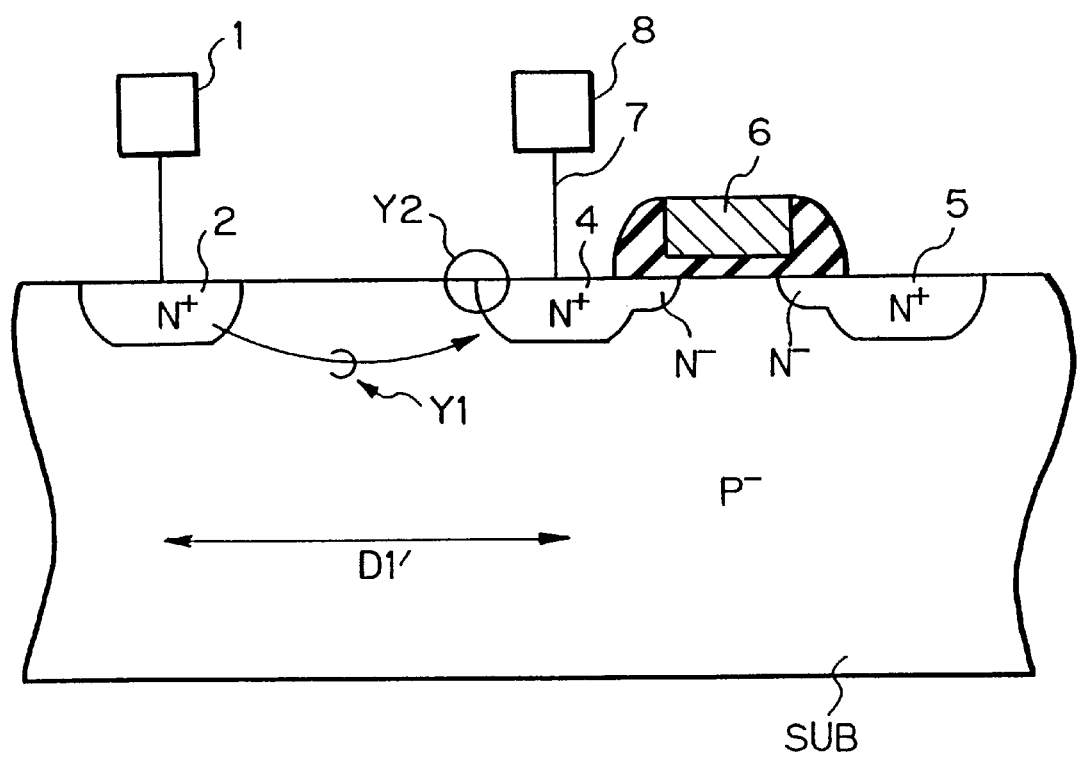
FIG. 8 is a cross-sectional view taken along the line VIII—VIII of FIG. 7.

Referring to FIG. 8, which is a cross-sectional view taken along the line VIII—VIII of FIG. 7, when a negative electrostatic pulse with respect to the ground terminal 8 is applied to the input terminal 1, electrons are injected from the input resistor 2 into the substrate SUB. Therefore, the electrons injected into the substrate SUB are diffused as indicated by Y1, and reach the source region 4. In this case, the electrons injected into a region of the source region 4 as indicated by Y2 serve as a high energy source due to a high electric field generated in the periphery of the source region 4. However, since the gate insulating layer between the substrate SUB and the gate electrode 6 and the N⁻-type region of the source region 4 are not present in the region as indicated by Y2, the gate insulating layer and the N⁻-type region of the source region 4 are hardly destroyed. Thus, the distance D' between the input resistor 2 and the transistor Q1 can be reduced.

Figure 9:
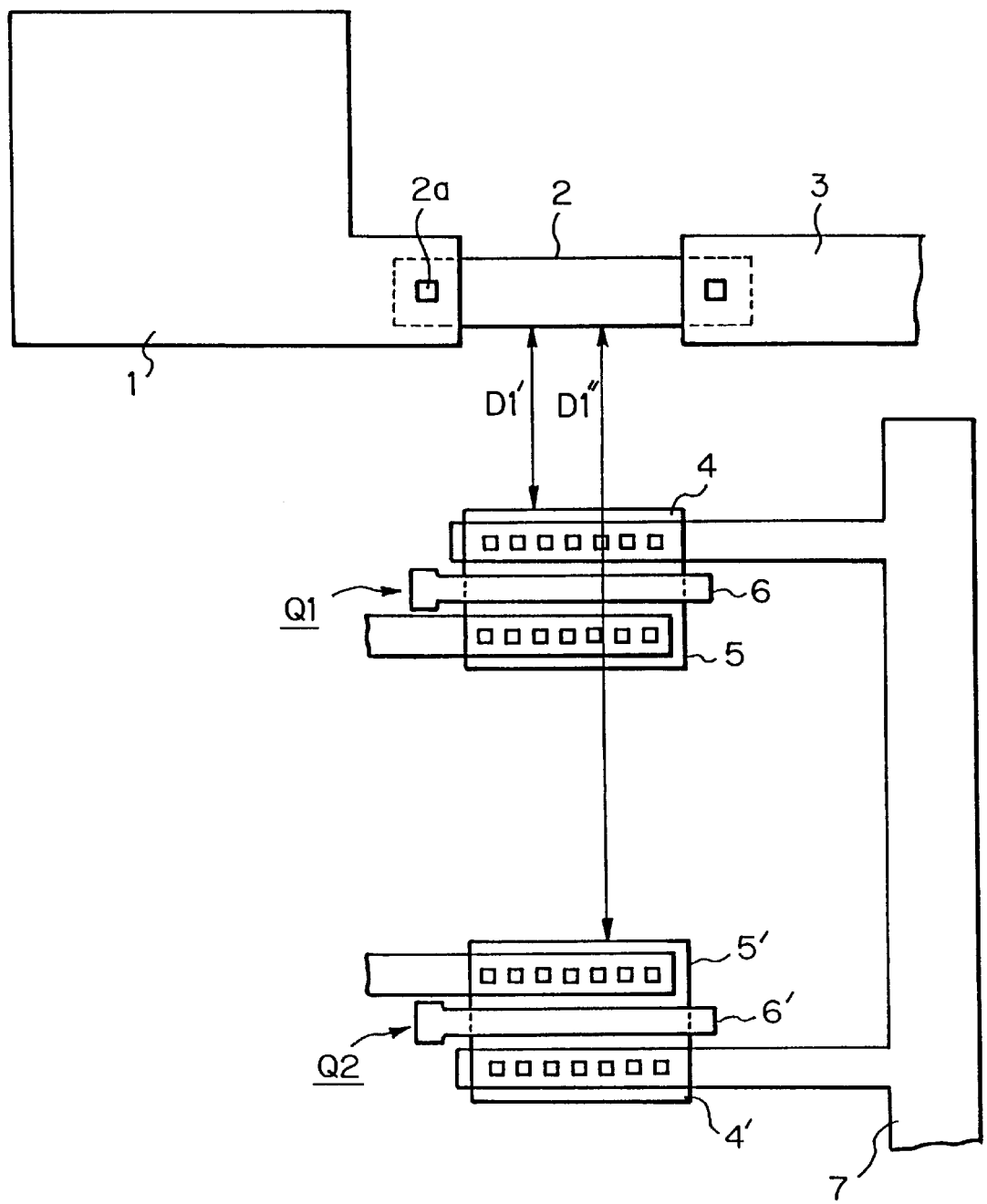
FIG. 9 is a layout diagram illustrating a modification of the device of FIG. 7.

In FIG. 9, which illustrates a modification of the device of FIG. 7, an N-channel MOS transistor Q2, which is formed by an N-type source region 4', an N-type drain region 5' and a gate electrode 6', is connected to the ground connection layer 7. In this case, the distance D1' between the input resistor 2 and the transistor Q1 is about 20 $\mu$m, smaller than the critical distance $D_{cr}$ the same as in FIG. 7. On the other hand, a distance D1" between the input resistor 2 and the transistor Q2 is about 150 $\mu$m. In this case, since the distance D1" is larger than the critical distance $D_{cr}$, it is unnecessary to make the source region 4' face the input resistor 2.

Figure 10:
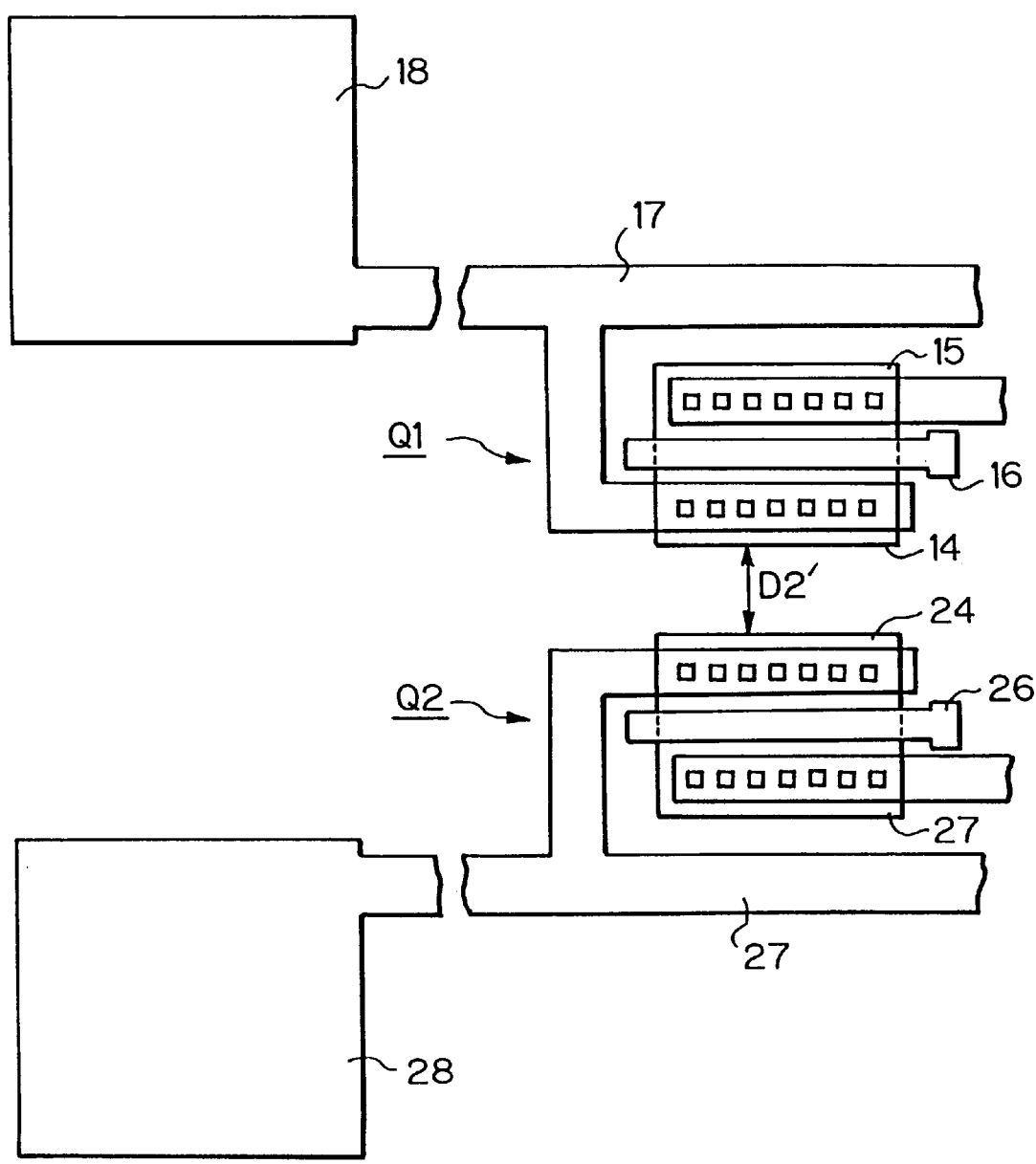
FIG. 10 is a layout diagram illustrating a second embodiment of the semiconductor device according to the present invention.

FIG. 10 illustrates a second embodiment of the present invention. Compared to the configuration of the transistors Q11 and Q12 illustrated in FIG. 5, the source region 14 rather than the drain region 15 of the transistor Q1 faces the transistor Q2. Also, the source region 24 of transistor Q2 rather than the drain region 25 of the transistor faces the transistor Q1. In this case, a distance D2' between the transistors Q1 and Q2 precisely, between the source region 14 of the transistor Q1 and the source region 24 of the transistor Q2 is about 20 μm smaller than $D_{cr}$.

In FIG. 10, even when a positive or negative electrostatic pulse is applied to the ground terminal 18 or 28, the gate insulating layers and the N⁻-type regions of the source regions 14 and 24 are hardly destroyed, in the same way as in the first embodiment.

Figure 11:
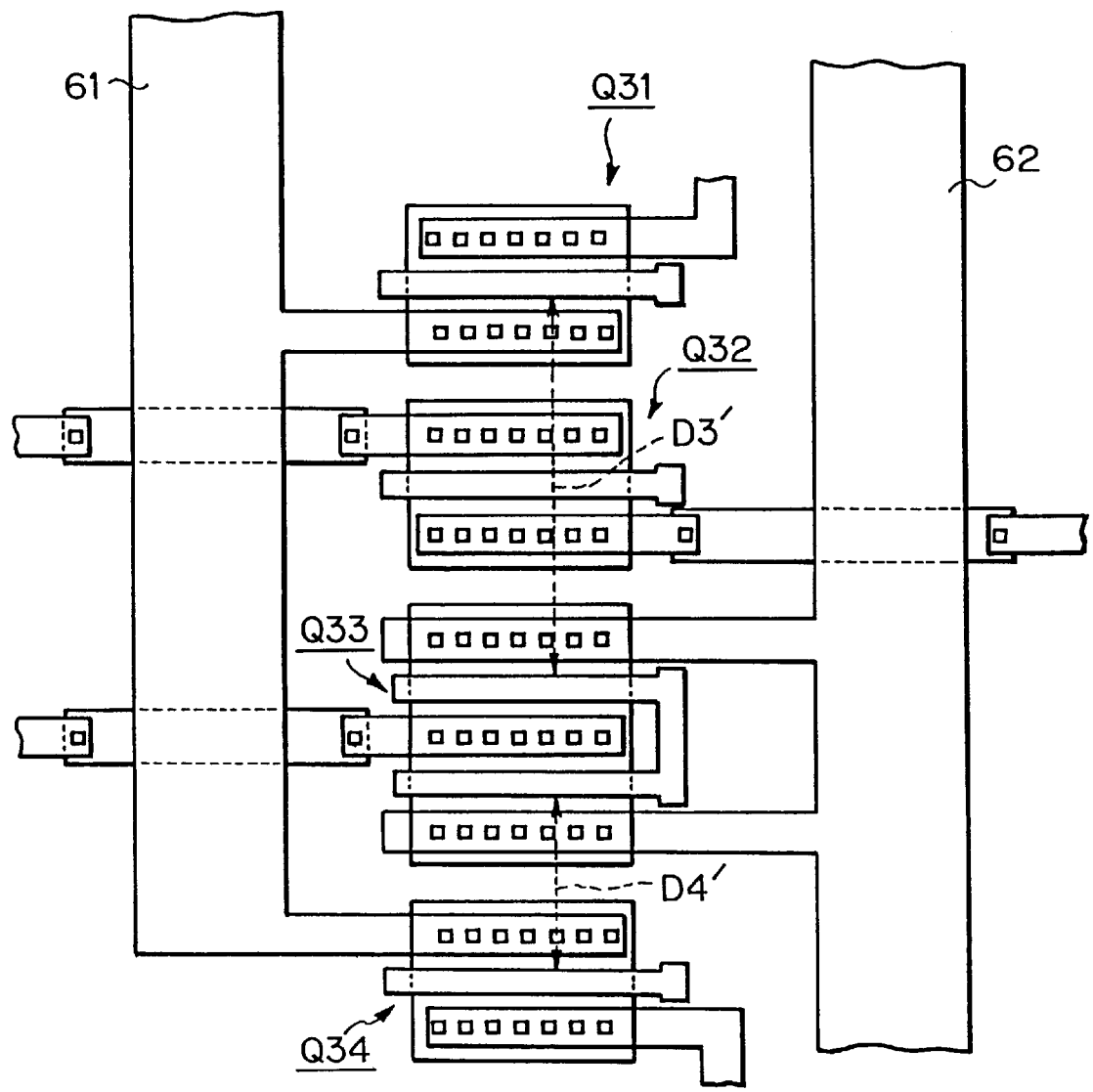
FIG. 11 is a layout diagram illustrating a third embodiment of the semiconductor device according to the present invention.

In FIG. 11, which illustrates a third embodiment of the present invention the source region rather than the drain region of the transistor Q31 of FIG. 6 faces the transistor Q33 of FIG. 6. Also, the source region rather than the drain region of the transistor Q34 of FIG. 6 faces the transistor Q33 of FIG. 6. Further, the transistor Q33 of FIG. 6 is modified to have two source regions surrounding a ladder-shaped gate electrodes. Therefore, the source region rather than the drain region of the transistor Q33 faces the transistor Q31 and Q34. In this case, a distance D3' between the transistors Q31 and Q33 is smaller than the distance D3 of FIG. 6. Also, a distance D4' between the source region of the transistor Q33 and the source region of the transistor Q34 is about 20 μm smaller than $D_{cr}$.

In FIG. 11, even when a positive or negative electrostatic pulse is applied to the ground connection layer 61 or 62, the gate insulating layers and the N⁻-type regions of the transistors Q31, Q32 and Q34 are hardly destroyed in the same way as in the first embodiment.

The embodiment as shown in FIG. 11 also includes two external terminals, each of which is coupled to a power supply voltage and/or ground. In addition, the semiconductor device as illustrated in FIG. 11 includes, for example, seven impurity diffusion regions of a conductivity type opposite to the conductivity type of the semiconductor substrate. At least one of the impurity regions, such as the third or fourth region, is coupled to one of the external terminals.

In FIG. 11, although the size of the device is increased by the ladder-shape of the transistor Q33, this is sufficiently compensated for by the reduction of the distances D3' and D4'.

In accordance with the present invention, the input and output terminals 1, 8 (for example) are connected to a power supply voltage and/or ground. In typical applications, one of the input and output terminals is connected to a power supply voltage, while the other is connected to ground. Yet, in other applications, the input and output terminals are both connected to a power supply voltage or connected to ground.

Also, the critical distance $D_{cr}$ is about 100 μm in the above-described embodiments. However, the critical distance depends upon the thickness of the gate insulating layer, the depth of the diffusion regions, the concentration of impurities in the substrate and the like.

As explained hereinbefore, according to the present invention, since a dead space for avoiding the destruction of a gate insulating layer and a low concentration impurity diffusion region by electrostatic discharge phenomena is reduced, the integration of the device can be enhanced.

What is claimed is:

1. A semiconductor device comprising:

a semiconductor substrate of a first conductivity type;

first and second external terminals formed on said semiconductor substrate; and first, second and third impurity diffusion regions of a second conductivity type opposite to said first conductivity type, formed in said semiconductor substrate, said first impurity diffusion region being connected to said first external terminal, said second and third impurity diffusion regions forming a source region and a drain region of a MIS transistor, one of said second and third impurity diffusion regions facing said first impurity diffusion region and being connected to said second external terminal, wherein, a distance between said first impurity diffusion region and said MIS transistor is about 20 μm smaller than a critical distance where said critical distance is about 100 μm.

2. The device as set forth in claim 1, wherein said first and second external terminals are ground voltage terminals.

3. The device as set forth in claim 1, wherein said first and second external terminals are power supply voltage terminals.

4. The device as set forth in claim 1, wherein one of said first and second external terminals is a ground voltage terminal and the other of said first and second external terminals is a power supply terminal.

5. The device as set forth in claim 1, wherein said MIS transistor has a LDD configuration.

* * * * *

UNITED STATES PATENT AND TRADEMARK OFFICE
CERTIFICATE OF CORRECTION

PATENT NO. : 6,081,013
DATED : June 27, 2000
INVENTOR(S) : Kaoru Norita

It is certified that error appears in the above-identified patent and that said Letters Patent is hereby corrected as shown below:

Column 4, line 52, delete "D" insert --D1 --.

Signed and Sealed this

Seventeenth Day of April, 2001

Attest:

NICHOLAS P. GODICI

Attesting Officer  Acting Director of the United States Patent and Trademark Office